(12) United States Patent
Gruber et al.

(10) Patent No.: US 7,867,842 B2
(45) Date of Patent: Jan. 11, 2011

(54) METHOD AND APPARATUS FOR FORMING PLANAR ALLOY DEPOSITS ON A SUBSTRATE

(75) Inventors: Peter Alfred Gruber, Mohegan Lake, NY (US); Paul Alfred Lauro, Brewster, NY (US); Jae-Woong Nah, Closter, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/181,852

(22) Filed: Jul. 29, 2008

(65) Prior Publication Data

US 2010/0028612 A1 Feb. 4, 2010

(51) Int. Cl.
*H01L 21/8242* (2006.01)
(52) U.S. Cl. ................. 438/253; 438/622; 257/E21.658
(58) Field of Classification Search ................. 438/253, 438/622; 257/E21.658
See application file for complete search history.

(56) References Cited

U.S. PATENT DOCUMENTS

| | | | |
|---|---|---|---|
| 4,412,642 A * | 11/1983 | Fisher, Jr. ................. 228/173.1 |
| 5,244,143 A * | 9/1993 | Ference et al. .......... 228/180.21 |
| 5,673,846 A * | 10/1997 | Gruber ................... 228/180.22 |
| 5,853,517 A | 12/1998 | Petefish et al. |
| 6,166,433 A * | 12/2000 | Takashima et al. .......... 257/702 |
| 6,276,596 B1 * | 8/2001 | Gruber et al. ............... 228/225 |
| 7,332,424 B2 | 2/2008 | Bélanger et al. |
| 2002/0110328 A1* | 8/2002 | Bischel et al. ................ 385/49 |

* cited by examiner

*Primary Examiner*—Charles D Garber
*Assistant Examiner*—Stanetta D Isaac
(74) *Attorney, Agent, or Firm*—Daniel P. Morris; Ryan, Mason & Lewis, LLP

(57) ABSTRACT

A method for forming alloy deposits at selected areas on a receiving substrate includes the steps of: providing an alloy carrier including at least a first decal including a first plurality of openings and a second decal including a second plurality of openings, the first and second decals being arranged such that each of the first plurality of openings is in alignment with a corresponding one of the second plurality of openings; filling the first and second plurality of openings with molten alloy; cooling the molten alloy to thereby form at least first and second plugs, the first plug having a first surface and a second surface substantially parallel to one another, the second plug having a third surface and a fourth surface substantially parallel to one another; removing at least one of the first and second decals to at least partially expose the first and second plugs; aligning the alloy carrier with the receiving substrate so that the first and second plugs correspond to the selected areas on the receiving substrate; and transferring the first plug to a first of the selected areas and the second plug to a second of the selected areas.

9 Claims, 5 Drawing Sheets

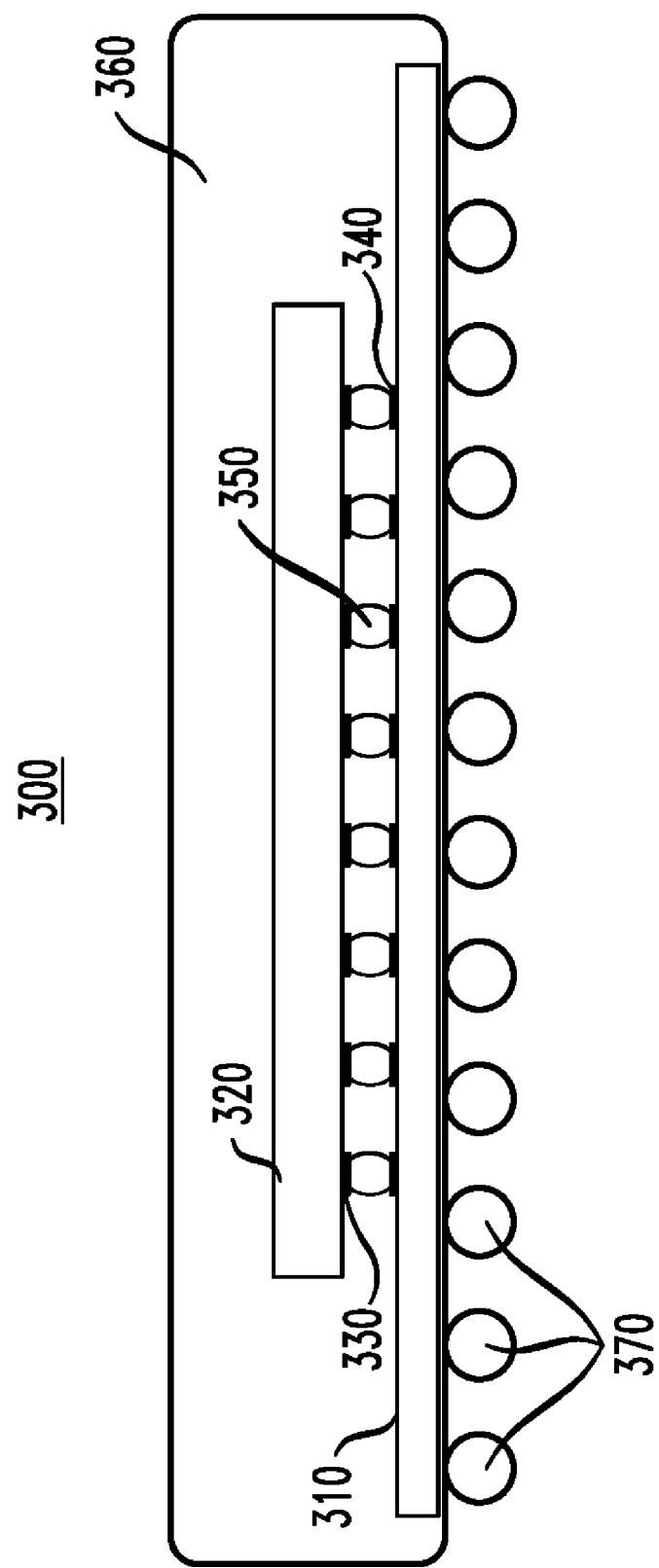

METHOD AND APPARATUS FOR FORMING PLANAR ALLOY DEPOSITS ON A SUBSTRATE

FIELD OF THE INVENTION

The present invention relates generally to electrical and electronic devices, and more particularly relates to semiconductor packaging and interconnection.

BACKGROUND OF THE INVENTION

Flip chip technology, first introduced in the 1960's by IBM as the controlled collapse chip connection (C4) process, offers a viable and proven alternative to standard assembly technologies for products requiring enhanced performance. Flip chip is not a specific package (like SOIC), or even a package type (like BGA). Rather, flip chip generally describes the method of electrically connecting an integrated circuit (IC) die, also referred to as a chip, to a package carrier. The package carrier, either substrate or leadframe, then provides the connection from the die to the exterior of the package. In "standard" IC packaging, the interconnection between the die and the carrier is made using bond wires, which exhibit disadvantages, particularly in high-frequency applications (e.g., about one gigahertz and above).

Flip chip has become popular primarily because it offers good electrical performance, small package size, and the capability of handling a relatively large number of input/output (I/O) connections. Early flip chip processing employed solder bumps formed on chip I/O pads. These solder bumps align with corresponding pad sites on the substrate. The solder bumped die is attached to the substrate by a solder reflow process, very similar to the process used to attach BGA balls to the package exterior. After the die is attached, underfill is added between the die and the substrate to control the stress in the solder joints caused by the difference in thermal expansion between the silicon die and the carrier. Once cured, the underfill absorbs the stress, reducing the strain on the solder bumps, greatly increasing the life of the finished package. The die attach and underfill steps are the basics of flip chip interconnect.

As flip chip technology is extended for use with chips having higher pin counts, smaller line-pitch and larger size, such as, for example, microprocessor chips and chipsets, the size of the solder bumps on the chip decreases, and thus the amount of tolerance to substrate warpage in the chip decreases accordingly. Consequently, reliability of standard flip chip technology is often unacceptable when used in such applications.

SUMMARY OF THE INVENTION

Illustrative embodiments of the present invention provide techniques for forming substantially coplanar solder bumps on a substrate so as to beneficially increase the tolerance of the chip to substrate warpage compared to conventional solder bump formation approaches. Techniques of the present invention accomplish this in a manner which advantageously eliminates a coining of the solder bumps as a separate step. Furthermore, techniques of the invention achieve transfer of the solder bumps to the substrate without directly applying additional heat to the substrate, or applying heat that is not sufficient to fully melt the solder plugs once they are formed. Because conventional solder reflow is not required to transfer the solder bumps to the substrate, the invention has an advantage of not exposing the substrate to elevated temperature. Moreover, because injection molded soldering only uses molten solder instead of mixed solder powders and flux, and because a decal is used as a fixture to constrain the solder, the invention has an advantage of providing sufficient solder bump volumes for ever smaller pitches without bridging between solder bumps.

In accordance with one aspect of the invention, a method for forming alloy deposits at selected areas on a receiving substrate is provided. The method includes the steps of: providing an alloy carrier comprising at least a first decal including a first plurality of openings formed therein and a second decal including a second plurality of openings formed therein, the first and second decals being arranged in abutting contact with one another such that each of the first plurality of openings is in alignment with a corresponding one of the second plurality of openings; filling the first and second plurality of openings with molten alloy; cooling the molten alloy in the first and second plurality of openings to thereby form at least first and second plugs, the first plug having a first surface and a second surface, the second surface being substantially parallel to the first surface, the second plug having a third surface and a fourth surface, the fourth surface being substantially parallel to the third surface; removing at least one of the first and second decals to at least partially expose at least the first and second plugs; aligning the alloy carrier with the receiving substrate so that the at least the first and second plugs substantially correspond to the selected areas on the receiving substrate; and transferring the first plug to a first of the selected areas and the second plug to a second of the selected areas, wherein contact is made between the first surface and the first selected area and between the third surface and the second selected area, wherein the transferring comprises at least one of applying a compression force, applying heat, and applying mechanical vibration to the second and fourth surfaces of the first and second plugs, respectively, such that the second and fourth surfaces are formed substantially within a same plane.

In accordance with another aspect of the invention, an integrated circuit is provided comprising alloy deposits formed at selected areas on a substrate of the integrated circuit. The alloy deposits are foamed on the substrate by a method including the steps of: providing an alloy carrier comprising at least a first decal including a first plurality of openings formed therein and a second decal including a second plurality of openings formed therein, the first and second decals being arranged in abutting contact with one another such that each of the first plurality of openings is in alignment with a corresponding one of the second plurality of openings; filling the first and second plurality of openings with molten alloy; cooling the molten alloy in the first and second plurality of openings to thereby form at least first and second plugs, the first plug having a first surface and a second surface, the second surface being substantially parallel to the first surface, the second plug having a third surface and a fourth surface, the fourth surface being substantially parallel to the third surface; removing at least one of the first and second decals to at least partially expose at least the first and second plugs; aligning the alloy carrier with the receiving substrate so that the at least the first and second plugs substantially correspond to the selected areas on the receiving substrate; and transferring the first plug to a first of the selected areas and the second plug to a second of the selected areas, wherein contact is made between the first surface and the first selected area and between the third surface and the second selected area, wherein the transferring comprises at least one of applying a compression force, applying heat, and applying mechanical vibration to the second and fourth surfaces of the first and second plugs, respectively, such that the second and fourth surfaces are formed substantially within a same plane.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 3 is a cross-sectional view depicting an exemplary packaged integrated circuit comprising coined solder bumps, in accordance with an embodiment of the present invention.

DETAILED DESCRIPTION OF THE INVENTION

Figure 1A:
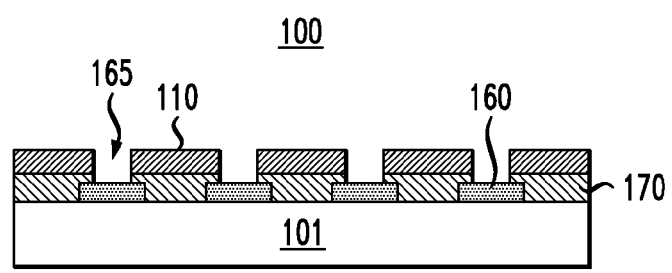
FIGS. 1A through 1H are cross-sectional views depicting an illustrative process for forming solder bumps on a substrate using a technique of stencil printing followed by reflow and coining.

The present invention will be described herein in the context of illustrative embodiments of a flip chip bonding methodology and an IC device employing same. It is to be appreciated, however, that the techniques of the present invention are not limited to the specific methods and device shown and described herein. Rather, embodiments of the invention are directed broadly to improved techniques for interconnecting an IC die to a substrate. For this reason, numerous modifications can be made to these embodiments and the results will still be within the scope of the invention. No limitations with respect to the specific embodiments described herein are intended or should be inferred.

Although combined in a novel manner, several of the processing steps described herein may be performed in conventional semiconductor processing, and, as result, will be familiar to those skilled in that art. Moreover, details of certain individual processing steps used to fabricate semiconductor devices described herein may be found in a number of publications, for example, S. Wolf and R. N. Tauber, *Silicon Processing for the VLSI Era, Volume 1*, Lattice Press, 1986; S. Wolf, *Silicon Processing for the VLSI Era, Vol. 4: Deep-Submicron Process Technology*, Lattice Press, 2003; and S. M. Sze, *VLSI Technology, Second Edition*, McGraw-Hill, 1988, which are incorporated herein by reference. It is also emphasized that the descriptions provided herein are not intended to encompass all of the processing steps which may be required to successfully form a functional device. Rather, certain processing steps which are conventionally used in forming integrated circuit devices, such as, for example, wet cleaning and annealing steps, are purposefully not described herein for economy of description. However one skilled in the art will readily recognize those processing steps omitted from this generalized description.

It should also be understood that the various layers and/or regions shown in the accompanying figures may not be drawn to scale, and that one or more semiconductor layers and/or regions of a type commonly used in such ICs may not be explicitly shown in a given figure for ease of explanation. This does not imply that the semiconductor layers and/or regions not explicitly shown are omitted from the actual IC device.

As previously stated, for chips having higher pin counts, smaller line-pitch and larger size, the size of solder bumps on the chip is decreased, thereby resulting in a reduced stand-off height. Stand-off height is an important factor affecting interconnect reliability. As stand-off height decreases, the tolerance for substrate warpage decreases accordingly, which can result in lower yield. Consequently, reliability of standard flip chip technology is often unacceptable when used in electronic packages employing high density interconnect substrates.

One interconnection technique for improving the tolerance of an IC packaging methodology to substrate and/or IC die warpage is to form additional solder bumps on the substrate. Substrate solder bumping helps increase assembly yield and the allowable stand-off height between the IC die and the substrate, and is therefore beneficial. Solder bumps on the substrate compensate for height variation in the solder bumps on the die. One approach to minimize the effects of substrate warpage on device reliability is to "coin" the solder bumps. Coining solder bumps, as will be described in further detail below, refers to a process of exerting sufficient downward pressure on a plurality of solder bumps for a prescribed amount of time to thereby cause the upper surfaces of the solder bumps to flatten, so as to be substantially within a same plane (i.e., coplanar). (See, e.g., J. W. Nah et al., *IEEE Transactions on Electronics Packaging Manufacturing*, Vol. 26, No. 2, April 2003, p. 166, the disclosure of which is incorporated herein by reference.) Coining substrate solder bumps enhances coplanarity of solder bump surfaces regardless of the amount of substrate warpage. Coplanarity ensures good flip chip interconnects over relatively large substrate areas. Coined substrate solder bumps also provide enlarged placement targets for the alignment of substrate and die.

One known method of forming solder bumps on substrate pads is to apply solder paste by screening, and then to reflow the screened solder paste to make substantially ball-shaped solder bumps. A low cost method of screening solder paste, which will be described in further detail herein below, is stencil printing. Stencil printing does not require additional lithography or vacuum process steps.

FIGS. 1A through 1H are cross-sectional views depicting an illustrative process 100 for forming coined solder bumps, or alternative alloy deposits, at selected areas on a receiving substrate using stencil printing followed by solder reflow and coining. With reference to FIG. 1A, a substrate 101 is shown including a plurality of pads 160 formed on at least a portion of an upper surface of the substrate. Substrate 101 may comprise, for example, an organic material, including, but not limited to flame retardant type 4 (FR-4), bismaleimide triazine (BT) resin, etc., or a semiconductor material, such as, for example, silicon, germanium, gallium arsenide, etc. A stencil mask 110 is positioned over the substrate 101. The stencil mask 110 includes a plurality of openings 165 therein, each of the openings being aligned with a corresponding one of the underlying pads 160. Optionally, a solder mask 170, or alternative spacer, may be employed (as shown) to prevent bridging of solder between adjacent pads 160. Solder mask 170, when used, is preferably formed on at least a portion of the upper surface of substrate 101 and under the stencil mask 110. Like stencil mask 110, solder mask 170 includes a plurality of openings 165 therein, each of the openings being aligned with a corresponding one of the pads 160.

Figure 1B:
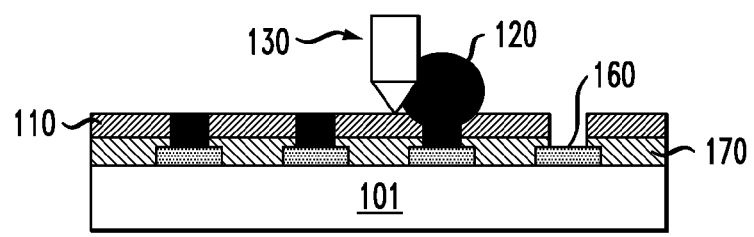
Figure 1C:
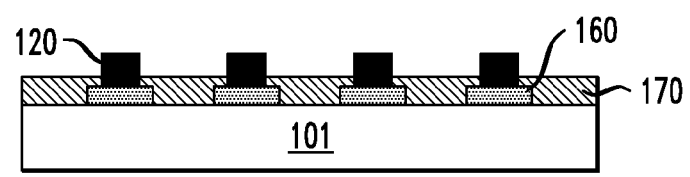

As depicted in FIG. 1B, stencil printing is preferably performed by moving a squeegee 130, or an alternative applicator, over stencil mask 110 to force a solder paste 120 into the holes in the stencil mask 110. The stencil mask 110 is then removed, exposing at least a portion of sidewalls and an upper surface of the resulting solder paste structure 120, as shown in FIG. 1C. Since the solder paste is conductive, the solder paste structures 120 provide electrical connection to the corresponding pads 160 on the substrate 101.

Figure 1D:
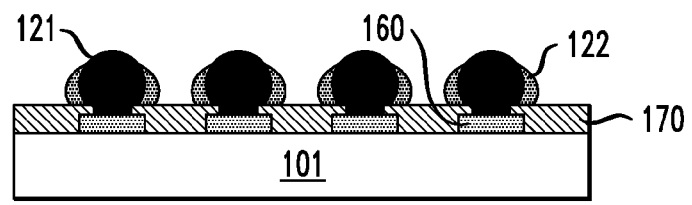
Figure 1E:
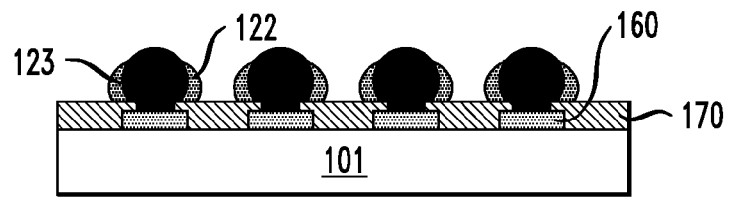
Figure 1F:
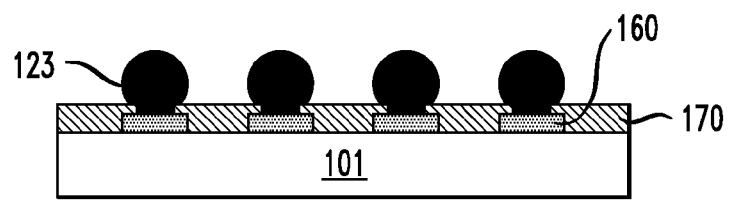

With reference now to FIG. 1D, the substrate 101 and solder paste structures formed thereon are elevated to a high temperature, typically about 30 to 40 degrees Celsius (° C.) over the melting temperature of the components in the solder paste (e.g., greater than about 210° C. for eutectic tin-lead (SnPb) solder (melting point 183° C.) and greater than about 250° C. for lead-free solder (melting point around 220° C.)). This solder reflow step can be carried out using, for example, forced air convection, infrared furnace, vapor phase, etc. By exposing the substrate to the elevated temperature, the solder paste will melt to form molten solder balls 121 against the upper surface of the solder mask 170. During this process, residual flux 122 may form around part of the molten solder balls 121. Heat is then removed and the molten solder balls 121 are subsequently cooled to form solid solder bumps 123, as shown in FIG. 1E. In FIG. 1F, the residual flux 122 is preferably removed.

Figure 1G:
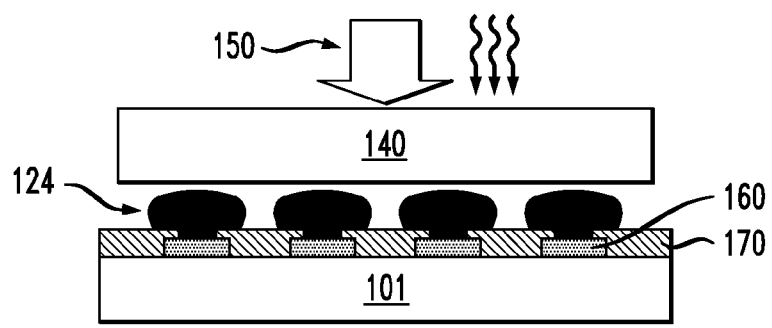
Figure 1H:
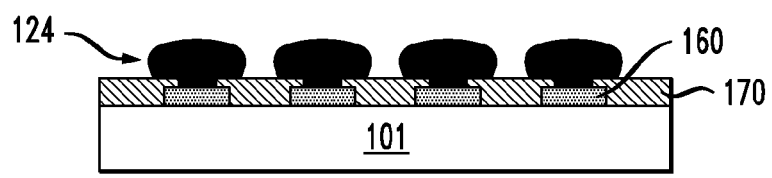

Subsequent to forming the solder bumps 123 on the substrate 101, the solder bumps are preferably coined by applying a thermal compression force 150 of sufficient pressure for a sufficient time onto a coining bar 140, as shown in FIG. 1G. U.S. Pat. No. 5,853,517 to Petefish et al. discloses one known method for coining solder balls on an electrical circuit package, the disclosure of which is incorporated by reference herein. The thermal compression force 150 applied through the coining bar 140 results in the formation of coined solder bumps 124. Lastly, the coining bar 140 is removed, as depicted in FIG. 1H. Because of substrate warpage and/or other anomalies of the solder bump process, the solder bumps may have different heights (when measured in a vertical direction above the substrate) relative to one another, which can create yield problems during interconnection of the substrate 101 with an IC die (not shown) during the flip chip bonding process. As previously stated, coining is used to flatten an upper surface of the solder bumps and ensures that the plurality of solder coins are substantially planar.

A stencil mask printing process of the type exemplified in FIGS. 1A through 1H can be used for fine pitch C4 substrate solder bumping of high density interconnect substrates for electronic packages. However, this technique is limited in its applicability for future platforms, particularly with requirements of decreasing C4 pitch and solder bump sizes. For example, attempts at printing at very fine pitches (e.g., less than about 120 μm) often produce unacceptable yields, with issues including mask lift-off, missing bumps, and low volume solder bumps. Another disadvantage of the stencil mask printing process is the requirement of an additional solder coining process after bump formation to form a flat surface.

FIGS. 2A through 2G are cross-sectional views depicting an exemplary process 200 for forming solder bumps on a substrate, in accordance with an embodiment of the present invention. Techniques of the invention provide, for example, a method and apparatus for making substantially flat-topped solder features on a substrate using a simplified injection molded soldering (IMS) process. Upper surfaces of the respective solder features are substantially coplanar relative to one another. Moreover, the illustrative IMS process advantageously eliminates the need for two-step processes of solder reflow step followed by a solder coining step, as required by the stencil printing process depicted in FIGS. 1A through 1H.

Figure 2A:
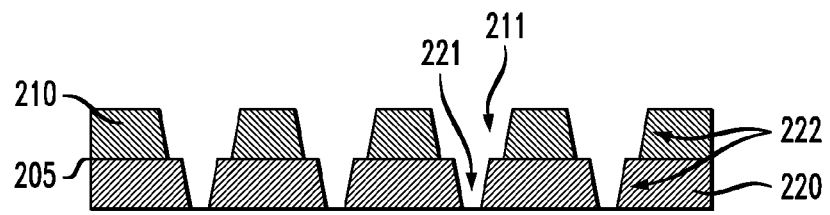
FIGS. 2A through 2G are cross-sectional views depicting an exemplary process for forming solder bumps on a substrate, in accordance with an embodiment of the present invention.

Referring now to FIG. 2A, a first step in an embodiment of the invention is illustrated. In this step, a decal solder alloy carrier 205 is formed including at least a first decal 210 and a second decal 220. As is known by those skilled in the art, the term "decal" generally refers to a structure (e.g., a mold) for forming and holding solder, which is initially in molten form when injected into the decal. First and second decals are preferably held together using mechanical means (e.g., clamps, elastic, etc.). Although only two decals are depicted in the figure, it is to be understood that the present invention is not limited to any particular number of decals used to form the solder alloy carrier 205. Decal solder alloy carrier 205 is preferably formed of a material that is non-wettable by solder alloys typically used in the semiconductor technology field, i.e., a material that has no metallurgical affinity with, and thus does not metallurgically bond to the solder alloy. In one illustrative embodiment of the invention, decal solder alloy carrier 205 is formed of a material having a relatively low thermal expansion coefficient, particularly a thermal expansion coefficient sufficiently lower than that of a target substrate onto which the solder alloy is to be transferred. First decal 210 need not be formed of the same material as that of second decal 220, although the first and second decals may be formed of the same material. Suitable materials for forming the decal solder alloy carrier 205 include, but are not limited to, polymer, silicon, germanium, gallium arsenide, glass, quartz, and like materials and/or compositions.

First decal 210 includes a first plurality of openings 211 therein adapted for carrying solder alloy. Likewise, second decal 220 includes a second plurality of openings 221 therein adapted for carrying solder alloy. The openings 211, 221 may be formed, for example, using a conventional laser drilling process and/or a photolithographic process, although alternative means for forming the openings are similarly contemplated (e.g., wet or dry etch, bulk micromachining, surface micromachining). The first and second decals 210, 220 are preferably arranged in abutting contact with one another such that each of the first plurality of openings 211 is in alignment with a corresponding one of the second plurality of openings 221, as shown. Each opening 211 in the first decal 210 and corresponding opening 221 in the second decal 220 forms a composite opening 222 in the decal solder alloy carrier 205. Openings 211 and 221 do not have to be the same diameter or shape. In alternative embodiments in which more than two decals are employed, there will be openings in each decal that are aligned such that there are composite openings that are continuous through all the decals.

Figure 2B:
Figure 2C:

FIG. 2B depicts the first and second decals 210, 220 after substantially filling composite openings 222 with molten solder 250. The molten solder 250 may be injected into composite openings according to an IMS process, for example, as described in U.S. Pat. No. 5,673,846, which is incorporated by reference herein, although other means may be employed for filling the composite openings. In general terms, IMS provides for injecting molten solder into the openings 222 formed in the decals 210, 220, and then cooling the solder down, or allowing the solder to cool, so that the solder solidifies within the openings, resulting in the formation of solid solder plugs 251, as shown in FIG. 2C. Typically, however, solder plugs 251 will not have as flat or as level an upper surface as desired.

Figure 2D:
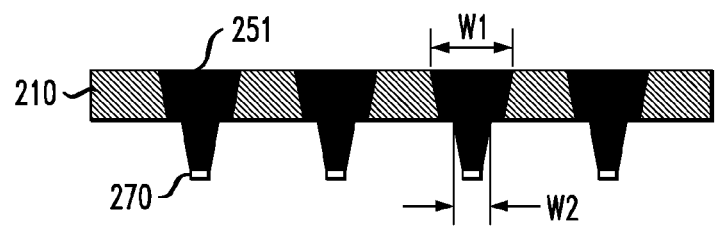

With reference to FIG. 2D, subsequent to cooling, second decal 220 is removed. Removal of the second decal 220 exposes at least a portion of solder plugs 251, such as a lower portion, thereby allowing the solder plugs to extend through material intervening between first decal 210 and the target substrate for electrical connection to corresponding pads on the substrate. For example, the intervening material may be solder mask 170 formed on substrate 101, as shown in FIG. 1A. The solder plugs 251 preferably remain in first decal 210 without falling through since a first width, W1, of a given opening at an upper surface of the first decal is preferably larger than a second width, W2, of the opening at a bottom surface of the first decal. The reach with which the exposed portions of the respective solder plugs 251 may extend through the intervening material for connection to the substrate will, inherently, be a function of the cross-sectional thickness of the second decal 220 (e.g., about 20 μm). Optionally, a layer of flux 270 may be formed on a bottom surface of each of the solder plugs 251 for improving solder wetting on the pads when the solder plugs are placed in contact with corresponding pads on the substrate so as to facilitate adhesion of the solder plugs to the corresponding pads on the substrate. Alternatively, a formic acid vapor may be applied during the solder transfer process, wherein the formic acid vapor is operative to remove oxide layers and improve adhesion of the exposed solder to the pads.

Figure 2E:
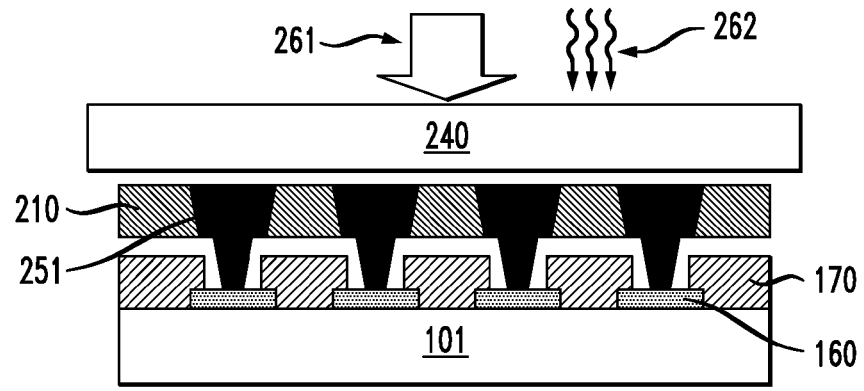

Referring now to FIG. 2E, solder plugs 251 in first decal 210 are substantially aligned to corresponding pads 160 formed on an upper surface of a substrate 101. As previously described in conjunction with FIG. 1A, a solder mask 170, or an alternative spacer, may be optionally formed on the upper surface of the substrate 101 to prevent bridging of solder between adjacent pads 160. Solder mask 170, when used, includes a plurality of openings therein, each of the openings being aligned with a corresponding one of the pads 160. Under prescribed heat 262 and compressive force 261 applied to a bar 240, or alternative structure suitable for uniformly transferring the compressive force and/or heat to solder plugs 251, the solder plugs are bonded to the corresponding pads 160. That is, solder plugs 251 are under sufficient pressure and heat for a sufficient time to bond to pads 160.

Figure 2F:
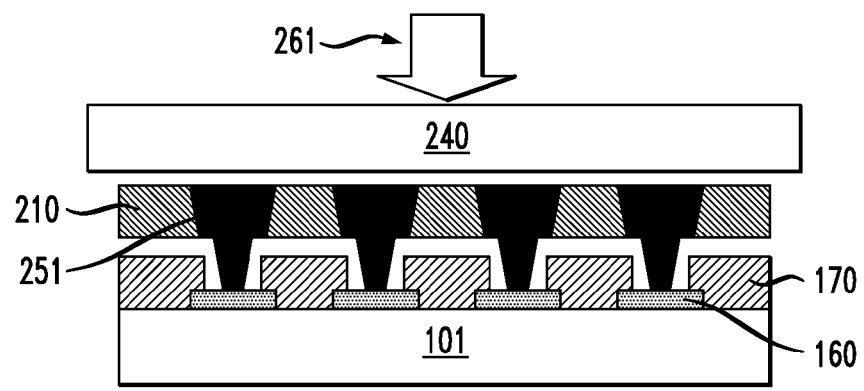

In this embodiment, the heat is preferably not sufficient to reflow the solder plugs; that is, the solder is not fully melted to form molten solder. In accordance with an alternative embodiment, sufficient heat is applied to reflow the solder plugs 251. In still another alternative embodiment, mechanical vibration may be applied to solder plugs 251 to assist in bonding to corresponding pads 160. In this instance, vibrational wetting support can be used to supplement standard oxide removal methods. In yet another alternative embodiment, shown in FIG. 2F, bonding of the solder plugs 251 to corresponding pads 160 is performed under a compressive force 261, without the addition of heat to the bar 240. However, this step preferably takes place in a heated environment, wherein the temperature of the environment may be slightly above the melting point of the solder material forming the solder plugs 251 (e.g., greater than about 180° C. for eutectic SnPb solder and about 220° C. for lead-free solder). Although the solder material forming the solder plugs 251 does melt during transfer, the solder material is constrained by the surrounding geometry/structure, including the top compressive force. These constraining forces are applied until the solder material has solidified, and thus the solder plugs retain this shape. Although FIG. 2E shows heat 262 and compressive force 261 applied to the bar 240, and FIG. 2F shows only compressive force 261 applied to the bar 240, the invention is not so limited. Heat 262 and compressive force 261 can, alternatively or in addition, be applied to the substrate 101. Moreover, the compressive force 261, although shown as being applied to an upper surface of the solder plugs 251, can, alternatively or in addition, be applied to a backside of the substrate 101. Mechanical vibration can be applied to the bar 240, the substrate 101, both the substrate and bar, or neither.

Another function of bar 240 is to form substantially flat and level upper surfaces of solder plugs 251, such that the upper surfaces of the solder plugs reside in substantially the same plane, i.e., coplanar. Application of compressive force 261 to the bar 240 and/or the substrate 101 causes pressure between the bar 240 and solder plugs 251. The pressure between bar 240 and solder plugs 251 causes the upper surfaces of the respective solder plugs 251 to flatten and thereby become substantially coplanar with one another. Likewise, heat 262, when applied, assists in reshaping (reforming) the upper surfaces of solder plugs 251 so as to be substantially flat and coplanar relative to one another. That is, the solder plugs 251 are preferably placed under sufficient pressure and/or heat for a sufficient time so as to produce substantially flat-topped, coplanar solder plugs. During this step, the first decal 210 can prevent bridging of solder between adjacent plugs.

Figure 2G:
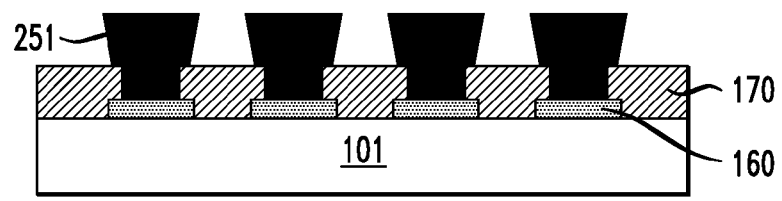

As shown in FIG. 2G, bar 240 and first decal 210 are preferably removed. Remaining are solder plugs 251 bonded on corresponding pads 160 formed on the upper surface of substrate 101, and, optionally, solder mask 170 formed on the upper surface of the substrate. As depicted in the figure, compressive force 261 and/or heat 262 applied to the bar 240 (FIG. 2E) preferably causes the solder alloy material forming the lower portion of solder plugs 251 to substantially fill openings in the solder mask 170 aligned with corresponding pads 160. Accordingly, the lower portions of solder plugs 251 will take on the shape of the openings in solder mask 170.

FIG. 3 is a partial cross-sectional view depicting an exemplary packaged integrated circuit 300 according to an embodiment of the present invention. The packaged integrated circuit 300 comprises a leadframe 310, or an alternative receiving substrate, a plurality of pads 340 formed on an upper surface of the leadframe, an integrated circuit die 320, and a molded encapsulation 360. The die 320 is attached to the leadframe 310 by methods of this invention described herein. For example, bonding pads 330 formed on a bottom surface of die 320 may be electrically connected to corresponding pads 340 formed on the upper surface of leadframe 310 via solder plugs 350. Encapsulation 360 preferably surrounds the die/leadframe combination, as in a conventional manner. Although FIG. 3 shows only one type of integrated circuit package, the invention is not so limited. Rather, the invention may comprise an integrated circuit die enclosed in essentially any package type.

At least a portion of the techniques of the present invention may be implemented in one or more integrated circuits. In forming integrated circuits, die are typically fabricated in a repeated pattern on a surface of a semiconductor wafer. Individual die are cut or diced from the wafer, then packaged as integrated circuits. In packaging the dies, individual die are attached to a receiving substrate according to methods of the invention. One skilled in the art would know how to dice wafers to produce integrated circuits. Integrated circuits so manufactured are considered part of this invention.

An integrated circuit formed in accordance with interconnection techniques of the present invention can be employed in essentially any application and/or electronic system. Suitable systems for implementing the invention may include, but are not limited to, personal computers, communication networks, portable communications devices (e.g., cell phones), etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An integrated circuit including a substrate and a plurality of alloy deposits formed at selected areas on the substrate, the plurality of alloy deposits being formed by a method comprising the steps of:

providing an alloy carrier comprising at least a first decal including a first plurality of openings formed therein and a second decal including a second plurality of openings formed therein, the first and second decals being arranged in abutting contact with one another such that each of the first plurality of openings is in alignment with a corresponding one of the second plurality of openings;

filling the first and second plurality of openings with molten alloy;

cooling the molten alloy in the first and second plurality of openings to thereby form at least first and second plugs, the first plug having a first surface and a second surface, the second surface being substantially parallel to the first surface, the second plug having a third surface and a fourth surface, the fourth surface being substantially parallel to the third surface;

removing at least one of the first and second decals to at least partially expose at least the first and second plugs;

aligning the alloy carrier with the receiving substrate so that the at least the first and second plugs substantially correspond to the selected areas on the receiving substrate; and transferring the first plug to a first of the selected areas and the second plug to a second of the selected areas, wherein contact is made between the first surface and the first selected area and between the third surface and the second selected area, wherein the transferring comprises at least one of applying a compression force, applying heat, and applying mechanical vibration to the second and fourth surfaces of the first and second plugs, respectively, such that the second and fourth surfaces are formed substantially within a same plane;

wherein following the transferring step, the second and fourth surfaces of the first and second plugs, respectively, are substantially flat.

2. The integrated circuit of claim 1, wherein the at least first and second plugs continuously remains a solid.

3. The integrated circuit of claim 1, wherein the plurality of decals comprises two decals.

4. The integrated circuit of claim 1, wherein the step of transferring comprises applying the compressive force to at least one of the at least first and second plugs and the substrate.

5. The integrated circuit of claim 1, wherein the step of transferring comprises applying the heat to at least one of the at least first and second plugs and the substrate.

6. The integrated circuit of claim 1, further comprising the step of inserting a spacer between one of the plurality of decals and the substrate, wherein the spacer is formed to avoid bridging of the alloy deposits.

7. The integrated circuit of claim 1, further comprising the step of applying a layer of flux on at least one of the at least first and second plugs and at least one of the selected areas on the receiving substrate, wherein the flux is operative to facilitate adhesion of the at least first and second plugs to corresponding selected areas on the substrate.

8. The integrated circuit of claim 1, further comprising the step of applying a formic acid vapor to at least one of the at least first and second plugs and to at least one of the selected areas on the receiving substrate, wherein the formic acid vapor is operative to improve adhesion of the at least first and second plugs to corresponding selected areas on the substrate.

9. The integrated circuit of claim 1, wherein the substrate is an organic substrate, and wherein the molten alloy comprises molten solder.

* * * * *